(12) United States Patent
Manning et al.

(10) Patent No.: US 6,344,913 B1
(45) Date of Patent: *Feb. 5, 2002

(54) OPTICAL CLOCK DIVISION

(75) Inventors: Robert J Manning; Alistair J Poustie; Julian K Lucek, all of Ipswich (GB)

(73) Assignee: British Telecommunications public limited company, London (GB)

(*) Notice: Subject to any disclaimer, the term of this patent is extended or adjusted under 35 U.S.C. 154(b) by 0 days.

This patent is subject to a terminal disclaimer.

(21) Appl. No.: 09/011,785

(22) PCT Filed: Apr. 30, 1997

(86) PCT No.: PCT/GB97/01178

§ 371 Date: Feb. 24, 1998

§ 102(e) Date: Feb. 24, 1998

(87) PCT Pub. No.: WO97/42543

PCT Pub. Date: Nov. 13, 1997

(30) Foreign Application Priority Data

May 8, 1996 (EP) .............................................. 96303216

(51) Int. Cl.$^7$ ............................................... H04J 14/08
(52) U.S. Cl. ...................... 359/138; 359/158; 359/139; 359/187; 359/188; 359/341; 359/346-349; 372/6; 372/25; 372/21; 372/26
(58) Field of Search .................. 359/158, 138, 359/139, 187, 188, 341, 346–349; 372/6, 25, 26, 21

(56) References Cited

U.S. PATENT DOCUMENTS

| 4,980,891 A | * 12/1990 | Izadpanah ...................... 372/25 |
| 5,493,433 A | 2/1996 | Prucnal et al. |
| 5,548,433 A | * 8/1996 | Smith .......................... 359/158 |
| 5,574,588 A | * 11/1996 | Kawanishi et al. .......... 359/158 |
| 5,625,727 A | * 4/1997 | Liedenbaum et al. .......... 385/16 |
| 5,742,415 A | * 4/1998 | Manning et al. ............. 359/128 |
| 5,774,246 A | * 6/1998 | Bulow .......................... 359/139 |
| 5,796,765 A | * 8/1998 | Lucek et al. ................... 372/25 |
| 5,940,198 A | * 8/1999 | Liedenbaum et al. ........ 359/158 |
| 5,959,753 A | * 9/1999 | Duling, III et al. .......... 359/158 |
| 5,999,287 A | * 12/1999 | Davies et al. ................ 359/118 |
| 5,999,293 A | * 12/1999 | Manning ..................... 359/139 |

OTHER PUBLICATIONS

Lucek J K et al: "Remoteiy programmable routing device with optical clock division" IEEE Photonics Technology Letters, Jan. 1995, USA, vol. 7, No. 1, ISSN 1041–1135, pp. 59–61, XP000488124 cited in the application see p. 61, right–hand column, line 10–line 34; figures 2,3.

Eiselt M et al: "Semiconductor laser amplifier in loop mirror configurations for signal–processing" ECOC '93. 19$^{th}$ European Conference on Optical Communication Proceedings, Montreux, Switzerland, Sep. 12–16, 1993, Switzerland, pp. 68–75 vol. 1, XP000492153 see paragraph 4.

Kang K I et al: "Demostration of all–optical Mach–Zehnder demultiplexer" Electronics Letters, Apr. 27, 1995, UK, vol. 31, No. 9, ISSN 0013–5194, pp. 749–750, XP002016357 see figure 1.

Manning R J et al: "All–Optical Clock Division Using A Semiconductor Optical Amplifier Loop Mirror With Feedback" Electronics Letters, vol. 32, No. 16, Aug. 1, 1996, pp. 1504–1506, XP000624495 see the whole document.

* cited by examiner

*Primary Examiner*—Leslie Pascal
*Assistant Examiner*—Hanh Phan
(74) *Attorney, Agent, or Firm*—Nixon & Vanderhye P.C.

(57) ABSTRACT

A clock signal at a divided clock rate is obtained from an optical signal stream at a higher clock rate. The optical signal stream at the higher clock rate is applied to an all-optical non- linear gate. There is feedback from the first output of the gate to its control input. The optical signal at a divided clock rate is present at a second output of the gate. The gate may comprise a non-linear loop mirror. A number of such gates may be cascaded in series to provide an output at a clock rate divided by $2^n$, where $n$ is an integer.

34 Claims, 9 Drawing Sheets

OPTICAL CLOCK DIVISION

BACKGROUND OF THE INVENTION

1. Field of the Invention

The present invention relates to the clock division of an optical signal.

2. Related Art

The need to derive a signal at a divided-down clock rate arises in a variety of contexts. For example, where a TDM (time division multiplexed) optical signal stream is used for communicating data, then a clock signal at less than the full bit rate of the data stream may be needed in the operation of a demultiplexer to select one or more time channels. Hitherto, when clock division has been required, this has commonly been carried out by tapping off part of the optical signal stream, detecting the signal to produce a corresponding timing wave in the electrical domain, and then dividing down the clock rate using conventional electronic clock-division circuits. With such an approach, before further optical processing can be carried out, a local optical source controlled by the electrical clock signal has to be used to take the divided signal back into the optical domain. Not only does this add undesirably to the cost and complexity of the relevant circuits, but the need for processing in the electrical domain severely limits the bit rates at which the circuit is capable of operating.

The paper by Lucek & Smith, IEEE PHOTONICS TECHNOLOGY LETTERS, January 1995, vol 7, no. 1, pp 1041–1135, discloses a remotely programmable routing device which may be used to provide a clock division function. While this has the advantage of being an all-optical device, it requires a relatively complex structure involving two stages. Data is first input to an ultra-fast gate stage where certain channels are selected. The non-linear element in the ultra-fast gate is a length of dispersion-shifted fibre. The output of the gate, which is a data signal containing the selected channels only, is then passed through a second stage comprising a mode-locked erbium laser. The effect of driving the laser with data channels is to produce a clock pattern with a "1" in each of the active channel timeslots, and a "0" elsewhere. The data signal passes on to an output port. The clock pattern, which may have a different bit pattern and is at a different wavelength to the data signal, is fed back as a control signal to the ultra-fast gate.

SUMMARY OF THE INVENTION

According to a first aspect of the present invention, there is provided a method of deriving a clock signal at a divided clock rate from an optical signal stream at a higher clock rate, comprising:

a) applying an optical signal stream to an all-optical non-linear gate, which gate includes a non-linear element;

b) feeding back an optical signal from an output of the said all-optical non-linear gate to the said non-linear element; and c) outputting an optical signal at a divided clock rate from the all-optical non-linear gate.

The present invention adopts an approach to clock-division which allows the function to be carried out entirely in the optical domain, using a relatively simple method which is well-adapted for implementation using integrated fabrication and which overcomes the disadvantages of the prior art circuits discussed above. An all-optical non-linear gate is used. Optical feedback is provided from the output of the gate to a control input of a non-linear element. With the gate configured in this manner, it is found that when an optical signal stream is applied at its input, then a signal at a divided clock rate is present at the output of the gate.

Preferably the optical signal stream is applied to an interferometric non-linear optical gate. This gate may comprise a non-linear loop mirror (NOLM) and more preferably an NOLM incorporating a semiconductor optical amplifier as its non-linear element. Alternatively other interferometric structures, such as a Mach Zehnder interferometer, may be used.

While the use of other types of optical gate is possible, the present inventors have found it to be particularly advantageous to use a non-linear interferometer, and particularly an NOLM in a TOAD (TeraHertz Optically Asymmetric Demultiplexer) configuration with a semiconductor optical amplifier (SOA) as the phase switching element. Such a device has the advantages of low switching energy and is capable of operating rates approaching 100 GHz. Moreover, specifically in relation to clock division, the use of a TOAD configuration has the further important advantage that the total delay time over the feedback path can be made as short as the bit period, even when the bit period may be as little as a few 10's of picoseconds. A further advantage of this preferred configuration is that the dynamics of the SOA support the clock division function.

Preferably the delay period associated with the optical feedback path is equal to the period between bits in the optical signal stream.

When the circuit is constructed to satisfy this constraint on the length of the delay over the optical feedback path, then in response to an input stream of the form "11111111", the output from the gate is in the form "10101010".

Alternatively, where the total length of the delay is greater than the period between consecutive bits in the optical signal stream, then the method may include an initial phase of programming the gate to carry out clock division by inputting to the gate a block of pulses having a predetermined bit-pattern and of sufficient length to fill both the gate and the feedback path.

As a further alternative, the circuit may include an SOA having a response time such that the circuit exhibits spontaneous clock division. In this case the method includes inducing spontaneous clock division in the non-linear gate by driving the semiconductor optical amplifier with the optical signal stream at a bit rate generally corresponding to the $e^{-1}$ recovery rate of the semiconductor optical amplifier.

The clock division circuit may comprise a plurality of stages each with its own respective non-linear gate, n such stages being cascaded in series to provide an output divided by $2^n$.

According to a second aspect of the present invention, there is provided a clock division circuit comprising:

a) an all-optical non-linear gate including,
   an optical input arranged to receive an optical signal stream at a higher clock rate,
   an optical output,
   a non-linear element connected between the optical input and the optical output; and b) an optical feedback path from the output of the gate to the non-linear element, in use an optical signal at a divided clock rate being output from the gate.

The present invention also encompasses a multiplexer or demultiplexer incorporating a clock division circuit in accordance with one or more of the preceding aspects of the invention.

BRIEF DESCRIPTION OF THE DRAWINGS

The present invention will now be described in further detail, by way of example only, with reference to the accompanying drawings in which.

DETAILED DESCRIPTION OF EXEMPLARY EMBODIMENTS

A clock division circuit CT1 comprises a non-linear optical gate 1. The gate has an optical input I at which it receives an optical signal stream. The gate 1 has two optical outputs O1, O2. One of these outputs O1 is connected via an optical feedback path 2 to a control input G for the gate. The feedback path may include an optical amplifier 3 and filter 4.

The optical gate 1, which may, for example, comprise an SOA in a fibre loop mirror as further described below, directs a signal received to the input I to one or other of the two output O1, O2 depending upon the presence or absence of a control signal at the input G. If the total delay time for transit through the gate and around the feedback path back to the input G is equal to the period p between successive bits, then the gate operates as follows to provide a divided clock signal. Assuming that the gate 1 is initially configured to switch pulses straight through to output O1, then the first pulse (labelled a in the Figure) output from O1 passes via the feedback path 2 to the control input G. Accordingly when the next pulse b arrives at the input, a control pulse is present at the control input G and so the pulse is switched to the second output O2. Accordingly one bit period later when pulse c arrives at the input there is no pulse present at the control input G and accordingly c passes to output O1. When pulse d arrives at the input the pulse from the feedback path corresponding to pulse c is present at the control input G and so pulse d is switched through to output O2. In this manner, the output at O2 comprises a pulse stream at half the bit rate of the input pulse stream.

When the delay time through the feedback loop is greater than one bit period, then the gate may still be programmed to effect clock division.

Figure 5:
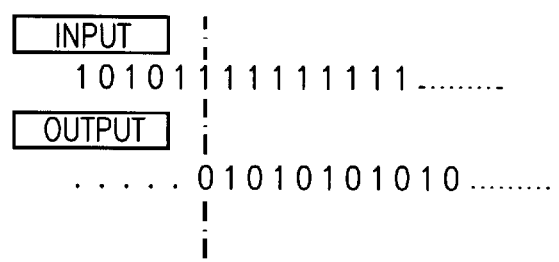
FIG. 5 shows a signal used to initialise the circuit of FIG. 1.

FIG. 5 shows an example of the signal used to initialise the circuit in the case where the total delay associated with the feedback path is equivalent to five bit periods. The upper sequence shows the input to the circuit, and the lower sequence is the output from the circuit. The lower sequence corresponds also to the control sequence fed back to the control input G. As in the first example above, the gate is initially configured to switch pulses straight through to output O1. A frame five bits long, that is to say corresponding in length to the feedback path, is used to initialise the circuit. The first five input bits correspond to the sequence "10101". These are passed straight thorough to output O1, and are also fed into the feedback path. In the sixth bit position corresponding to the first bit of the next frame and marked with a dashed line in the figure, the input bit value, like the preceding bit value, is "1". At this instant, the first bit of the first frame, having bit value "1" reaches the control input G. The "1" in the sixth bit position is therefore switched to the other output O2. Bit value "0" therefore appears in the output from port O1. The value of the bit input in the seventh bit position is "1". As this is input to the gate the second bit from the first frame reaches the control input. This has value "0" and accordingly the gate is set to transmit the seventh bit straight through to output O1. This pattern is repeated for successive bits, so that the overall output from O1 is in the form "10101". Therefore, even though the input to the gate is now a continuous stream of "1"s the output continues to replicate the bit pattern applied in the initialisation phase, to provide a clock-divided output at half the bit rate.

As a further alternative to the approaches discussed above, the circuit may be designed to operate with a feedback path more than one bit long, but without requiring initialisation in the manner of the immediately proceeding example. This is achieved by using a semiconductor non-linear element, and by exploiting the dynamics of the semiconductor by operating in a regime where spontaneous clock division occurs.

In this example, the phenomena of clock division and other complex dynamic behaviour are due to the finite lifetime of semiconductor optical amplifiers (typically around 300 ps) combined with the effect of feedback as a memory. When the signal input to the circuit has a repetition rate less than the natural recovery rate of the SOA, then, without initial programming as described above, "block" behaviour is observed, and there is no pulse-to-pulse interaction since the gain of the amplifier recovers fully between pulses. However, at higher repetition rates, when the pulse separation become comparable to the amplifier lifetime, there is interaction between pulses since the phase shift experienced by any pulse depends on the pattern of the previous few pulses. In such a system with feedback, it is the memory of the initial start up sequence which affects subsequent pulses. The exact dynamical sequence leading to clock division is quite complicated and evolves over several frame periods before a stable state occurs. In this stable state full recovery of the amplifier is possible between clock-divided pulses. This mode of operation is entirely self-starting and so, as already noted, does not need to be programmed as with the proceeding example. Since the circuit generates alternate "blocks" or frames and their logical complement in the output, it gives a continuous clock-divided pulse sequence only when the frame contains an odd number of pulses.

The inventors have carried out numerical modelling of this system which confirms the effects described above, and which also predicts a period-doubling route to chaos for the system as the pulse power varies.

FIGS. 6a to 6f show the results of numerical modelling of the system.

Figure 6A:
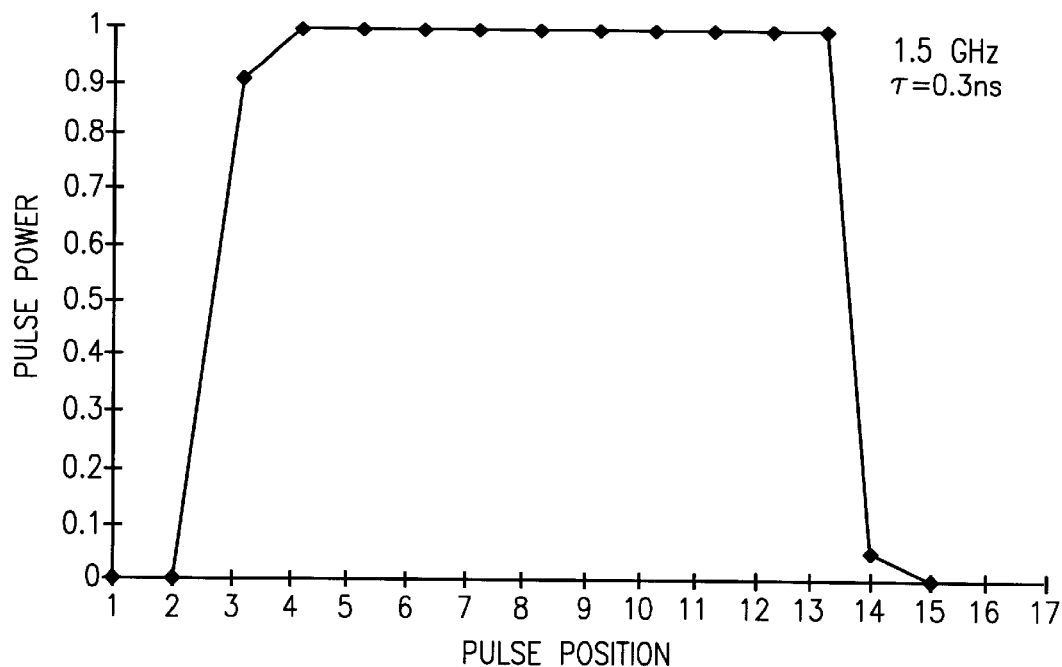
FIGS. 6a to 6f illustrate the onset of spontaneous clock division in a circuit using a semiconductor non-linear element.

FIG. 6a shows the behaviour of the system when the input pulse stream has a repetition rate of 1.5 GHz. The amplifier $e_{-1}$ recovery period is 0.3 ns. At this bit rate, the separation between pulses is significantly greater than the recovery time, and so, in the absence of bit-to-bit interaction, the output is the form of blocks having a period corresponding to the delay length of the feedback path. However, as the bit rate is increased, and so the bit separation is decreased, interaction between successive pulses begins to take place.

Figure 6B:
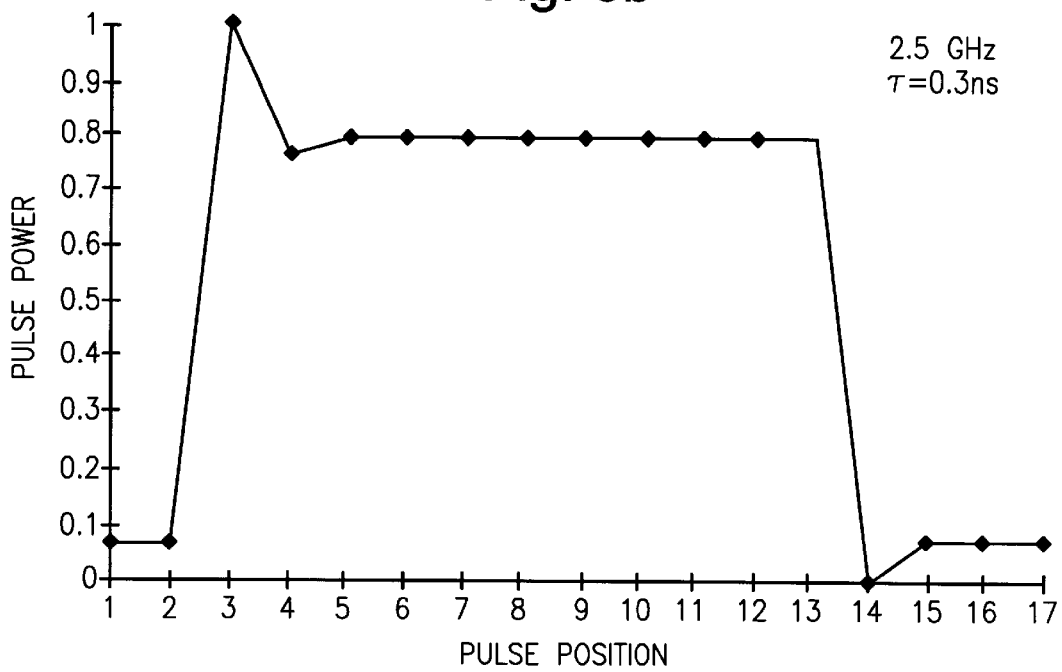

FIG. 6b shows the onset of this. In pulse 4, the amplifier has not yet fully recovered from the marked decrease in carrier population associated with pulse 3. Accordingly the level of pulse 4 is diminished by comparison with pulse 3 and the succeeding pulses.

Figure 6C:
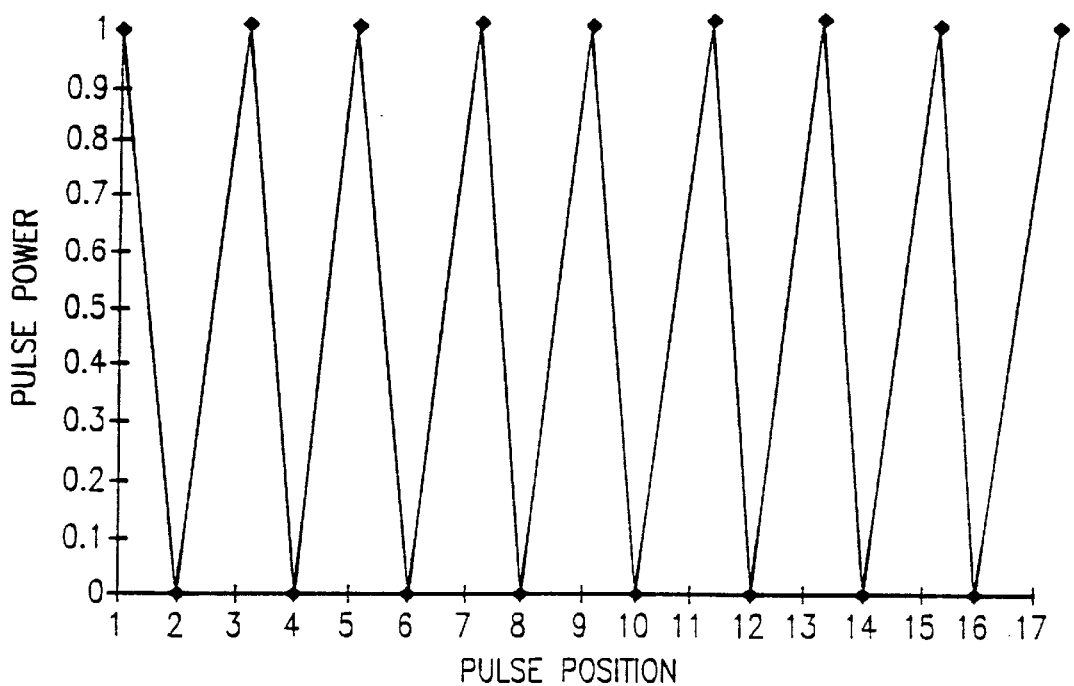

FIG. 6c shows that at 2.8 GHz, the interaction between successive bits has resulted in spontaneous clock division. Instead of the entire block being switched and output, only alternate pulses are switched.

Figure 6D:
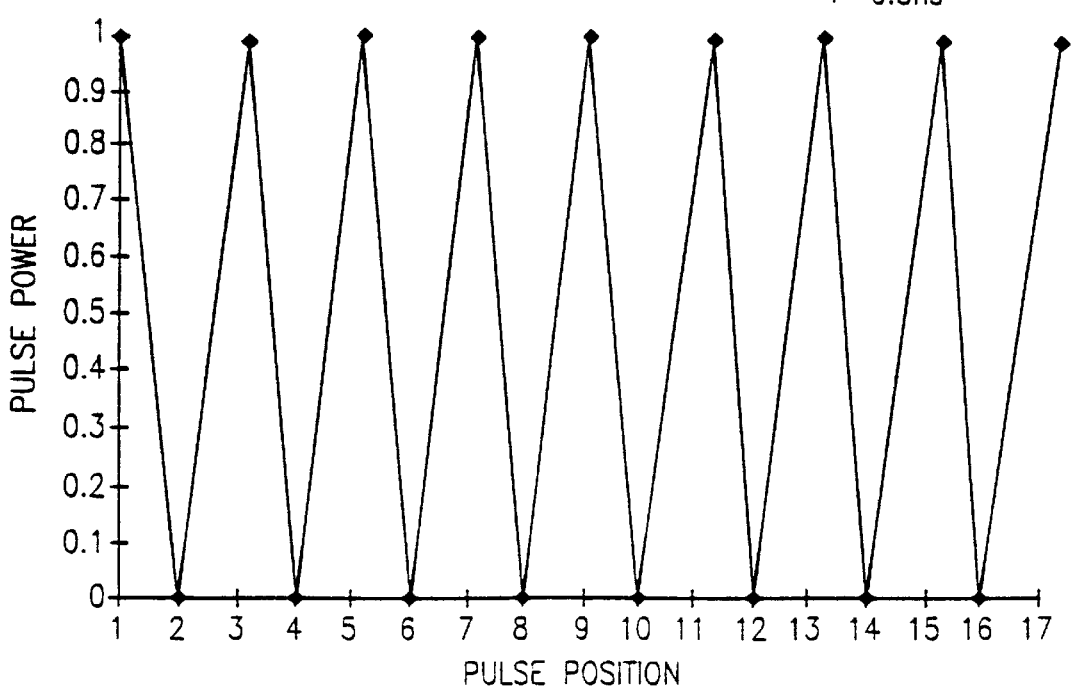

As shown in FIG. 6d, this behaviour is maintained as the bit rate is further increased to 3 GHz.

Figure 6E:
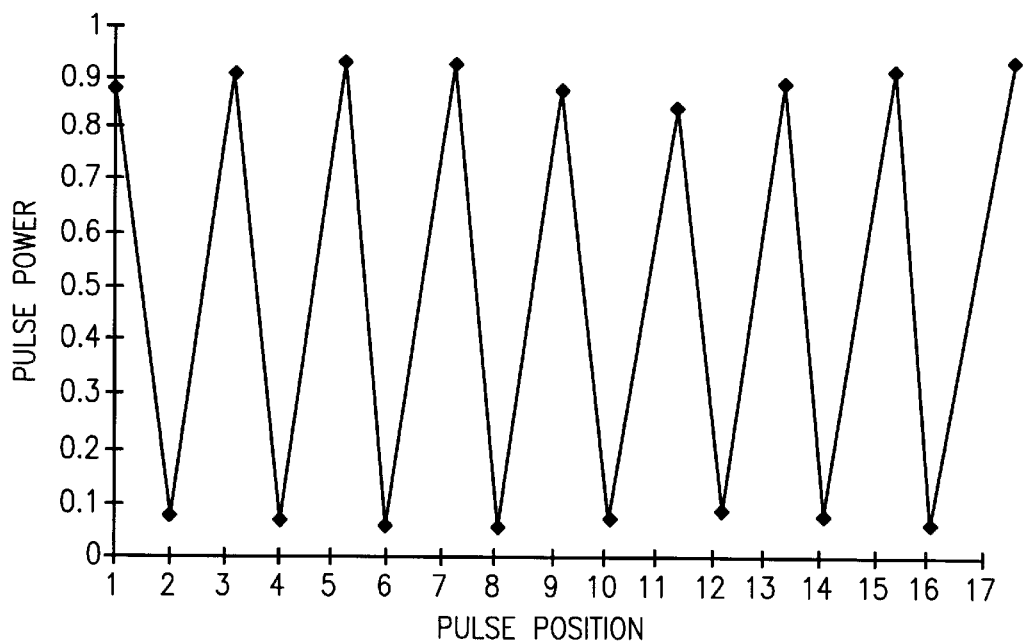
Figure 6F:
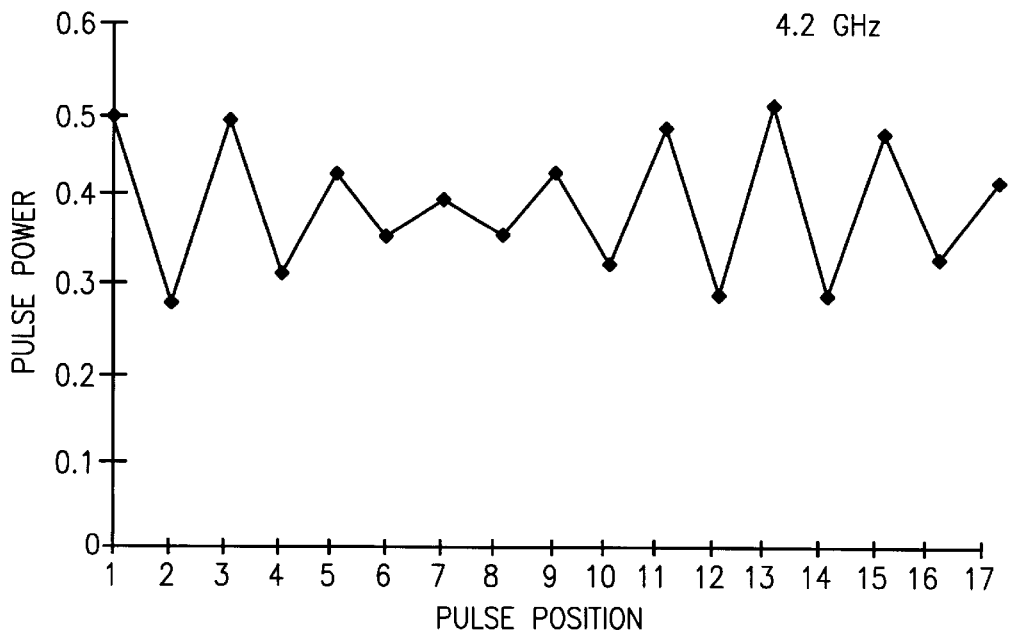

As shown in FIG. 6e, around 4 GHz the clock division behaviour begins to break down as other dynamical processes come into play. By 4.2 GHz (FIG. 6f) these other processes become dominant and the clock division behaviour is substantially lost.

It is found that the critical parameter in producing the clock-division behaviour is the ratio of the pulse rate to the amplifier $e^{-1}$ recovery rate. For optimum clock-division behaviour these rates should be substantially equal, although, as illustrated in the example above, the precise ratio is not critical, and clock division will occur over a range of values for this ratio provided that the recovery rate and pulse rate are generally comparable. For example, as seen above, clock division may continue until the pulse rate differs from the $e^{-1}$ recovery rate by more than 30%.

Figure 7A:
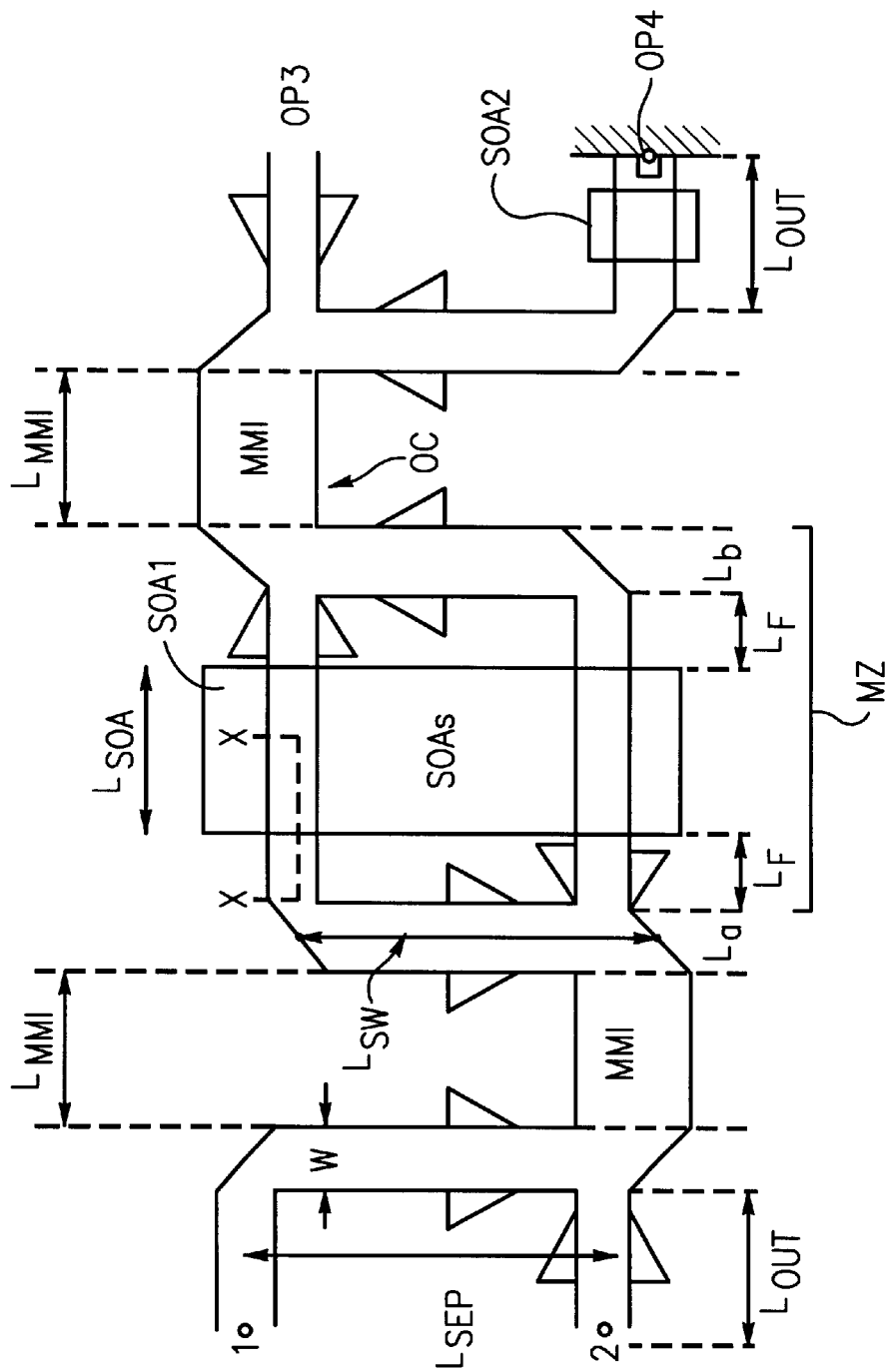
FIGS. 7a and 7b illustrate an embodiment with a single-bit feedback delay.
Figure 7B:
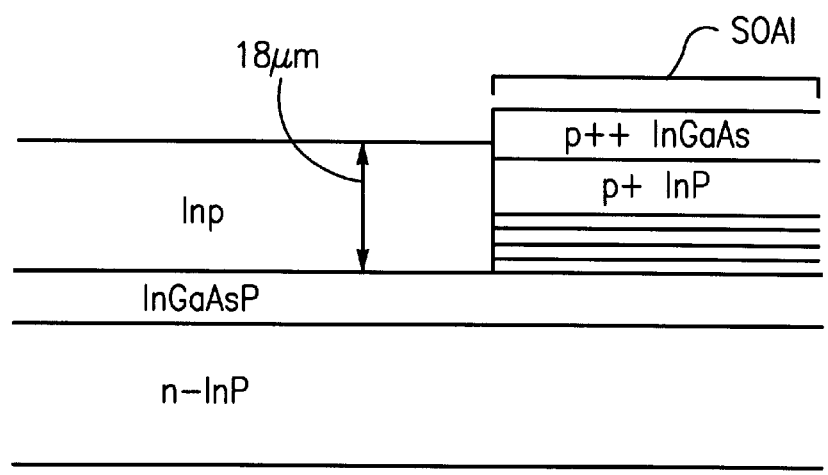

FIGS. 7a and 7b illustrate an embodiment of the first circuit described above, that is a circuit having a short feedback path equal in length to a single bit period. In this example, the non-linear gate is an interferometric device using an integrated Mach-Zehnder structure. The circuit is formed in an III-V semiconductor substrate, which in this example is indium phosphide. Waveguides defining the paths for the optical signals are formed using ridge-waveguide structures. The Mach-Zehnder portion MZ comprises two arms offset by a length $L_{sw}$ which determines the length of the switching window. Semiconductor optical amplifiers SOA1 are integrated with each of the two arms. The SOA in each arm is individually controllable. Signals from the two arms are fed to an output coupler OC which is a multimode interference coupler of the type described by the paper by Soldano et al, "Planar Monomode Optical Couplers Based on Multimode Interference Effects", Journal of Lightwave Technology, 10, No. 12, December 1992, pp1843–1850. This couples the output of the MZ stage to two output ports OP3, OP4 which correspond in function to the output ports O1, O2 of the device shown schematically in FIG. 1. The feedback signal to the MZ gate is provided by a mirror formed by providing a reflective coating on the facet of the waveguide at the output port O4. A further amplifier SOA2 in the arm going to output port OP4 amplifies the reflected signal which is then fed back to the amplifier SOA1 in the Mach-Zehnder portion MZ. The reflected signal acts as a control input to determine the state of SOA1. In order to reduce loss, the structure may use a combination of deep and shallow-etched passive waveguides, with tapers formed in different regions of the waveguides for mode conversion.

In this structure, the total length $L_{TOT}$ of the feedback path around the switch is given by $L_{TOT}=L_{OUT}+L_{SW}+L_{MMI}+L_F+L_b+\frac{1}{2}(L_a+L_b)$. In this example, $L_{TOT}$ is approximately 900 μm which at a refractive index of 3.5 corresponds to a delay of 10 ps. This in turn corresponds to a single-bit delay at a bit rate of 100 GHz.

FIG. 7b is a cross section through the line XX in FIG. 7a. It shows part of the waveguide in the upper arm of the MZ portion, including part of the SOA. The SOA is a multiple quantum well (MQW) device, evanescently coupled to the waveguide layer. The waveguide layer is formed as a InGaAsP quaternary layer.

Figure 2:
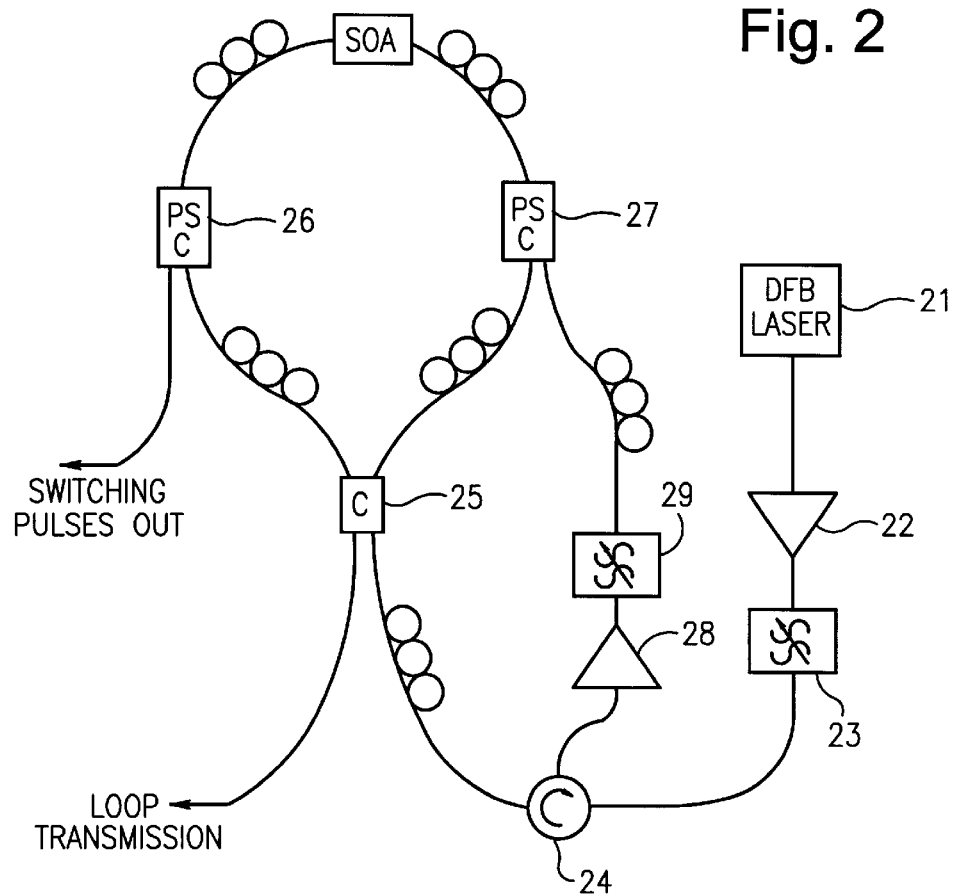
FIG. 2 is a schematic of a fibre loop mirror suitable for use in the circuit of FIG. 1.

An alternative SOA suitable for use as the non-linear element in the circuit of FIG. 2 is a large spot size amplifier. The use of a large spot size allows easier and more efficient coupling of input and output beams from optical fibres. The large spot size amplifier also has angled facets which prevent lasing from occuring. The large spot size amplifier is described in A E Kelly, I F Lealman, L J Rivers, S D Perrin and Mark Silver, "Polarisation insensitive, 25 dB gain semiconductor laser amplifier without antireflection coatings", Electronic Letters, vol 32, no. 19, September 1996, pp1835–1836; A E Kelly, I F Lealman, L J Rivers, S D Perrin and Mark Silver, "Low noise figure (7.2 dB) and high gain (29 dB) semiconductor optical amplifier with a single layer AR coating", Electronics Letters, vol. 33, no.6, March 1997, pp 536–538. Although particularly suitable for use in the hybrid circuit of FIG. 2, this amplifer type might also be included in integrated structures such as that of FIG. 7.

A further alternative amplifier, suitable for use as the non-linear element in both hybrid and integrated embodiments of the invention is a larger bandgap SLA (semiconductor laser amplifier). The alpha factor, that is the ratio of the phase change to the amplitude change of a signal in the amplifier, is a strong function of the wavelength of the signal. The value of alpha increases asymptotically at the band edge. A large alpha factor is desirable for TOAD operation. Using a device with a large bandgap brings the operating wavelengths, e.g. 1547 nm and 1536 nm closer to the band edge and hence gives a larger alpha. The band edge is more clearly defined in a MQW device. In the present example, the optical amplifier is a 7 well MQW device. The well is formed of unstrained InGaAs and the barrier layer is 1% tensile-strained InGaAs. This has a photoluminescence wavelength of 1.553 microns and this wavelength broadly corresponds to the band edge.

Figure 8:
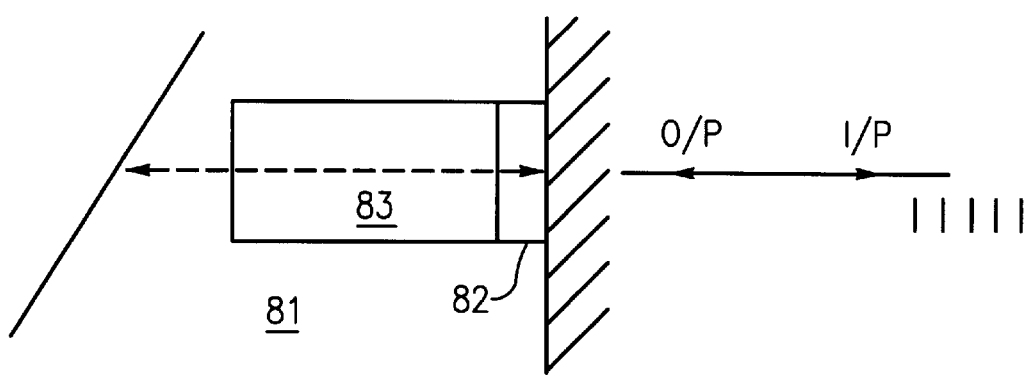
FIG. 8 shows an embodiment using a laser cavity including a saturable absorber as the non-linear element.

FIG. 8 shows a second example of a circuit suitable for use with a feedback delay of one bit period, although it may also be used with a feedback delay of more than one bit period through the use of an initial programming phase as described above. In this example, the non-linear gate comprises a saturable absorber 82 in a laser cavity 81 including a semiconductor gain medium 83. The saturable absorber 82 may be, for example, ion-implanted InGaAsP and the whole device may be formed as an integrated semiconductor structure. In this example, one of the cavity mirrors of the laser is partially reflective and so both provides an output port, and also reflects light back into the saturable absorber in order to provide the feedback path. The other mirror defining the cavity is in this example, a reflective grating structure, which serves also to tune the cavity to a specific wavelength. As in the loop mirror examples discussed previously, the saturable absorber provides an intensity-dependent non-linearity with a response time which is slow compared to the bit separation. The response time is typically 10's or 100's of picoseconds. The feedback signal reflected back from the output optically biases the absorber so that it absorbs or transmits according to the value of the feedback signal. The amplifier 83, which in this example is formed integrally with the absorber, provides amplification for the signal in the feedback path.

FIG. 2 shows a further embodiment relevant to the second and third schemes outline above. The switch in this example is formed from a TOAD-configured fibre loop mirror. The optical source in this case is a jitter-suppressed gain-switched distributed feedback (DFB) laser 21 operating at 1.55 μm, and producing a 2.5 GHz train of pulses of around 20 ps duration. This pulse train passes throught a first erbium doped fibre amplifier 22 and a filter 23. The pulse train is injected after amplification and filtering into the fibre loop mirror. An SOA is positioned in the loop and is spatially offset from the loop centre by around 3 cm to give a switching window of around 150 ps. The loop includes a 50:50 fibre coupler 25. Two polarisation selective fibre couplers 26,27 are used in the loop to introduce and reject the orthogonally polarised switching pulses. These pulses then act as switching pulses for the SOA. The mean power in the pulse train for switching is around 2.5 mW at 2.5 GHz corresponding to around 1 pJ per pulse. Since the fibre lengths are fixed, the relative arrival time of the switching pulses at the SOA with respect to pulses in the loop can be varied by adjusting the repetition rate of the source. The repetition rate is also used to vary the total number of pulses in the feedback loop. Pulses reflected by the loop mirror in its linear mode of operation are amplified, polarisation rotated and fed back into the loop as switching pulses. An optical circulator 24 is used to select the reflected pulses which are then amplified by a second erbium doped fibre amplifier 28 and filtered by filter 29. Fibre polarisation controllers are used to define the polarisation state of the pulses in the various parts of the circuit.

Figure 3A:
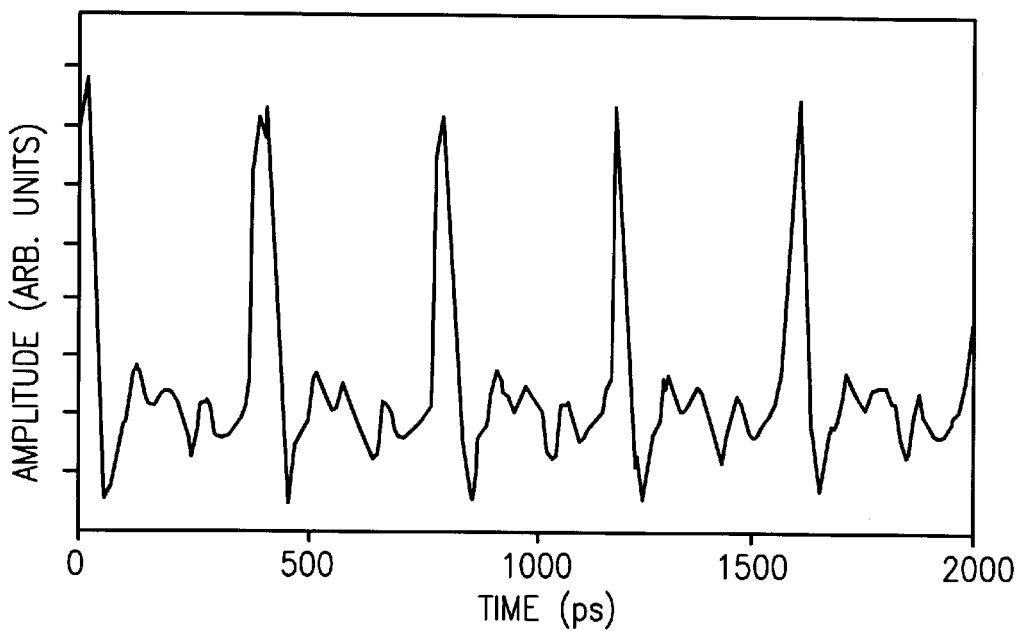
FIGS. 3a and 3b are plots of the temporal input and output respectively of the circuit of FIG. 2.
Figure 3B:
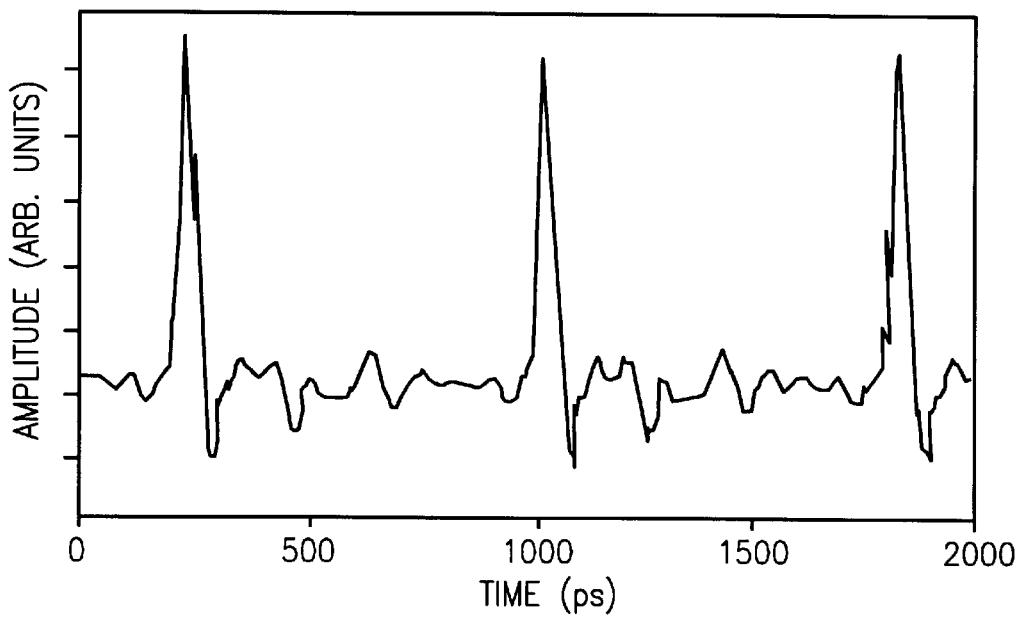
Figure 4A:
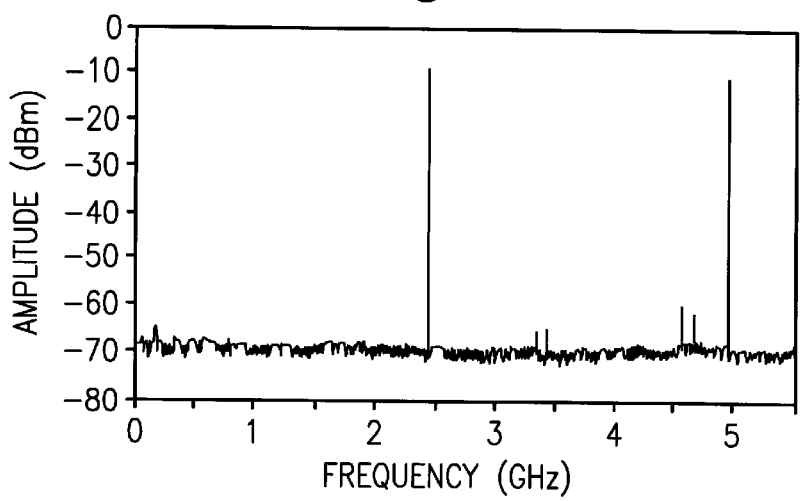
FIGS. 4a and 4b are plots of the microwave spectra of the circuit of FIG. 2.
Figure 4B:
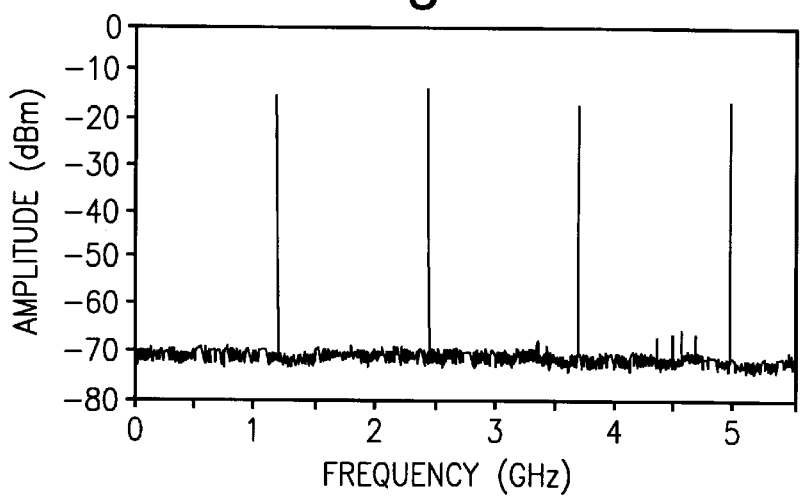

FIGS. 3a and 3b show the temporal output of the input pulse train (a) and the loop output (b) when the feedback path contains an odd number of pulses. The clock division operation is clearly seen. The extinction ratio of the output is around 15 dB which corresponds to the extinction of the loop, and the temporal output is extremely stable over several hours. The corresponding microwave spectra of the pulse trains are shown in FIGS. 4a and 4b. The clock-divided spectrum contains extremely narrow resonance's at half the frequency of the input pulse train, which indicates that the clock division pattern is a pure divide-by-two operation. When the number of pulses in the feedback path is even, more complicated behaviour is observed, and the microwave spectrum becomes more structured. Stable clock division is only achieved with an odd number of pulses, as explained previously.

At a line rate of 2.5 GHz, the circuit of FIG. 2 exhibits spontaneous clock division, as discussed above. However, the circuit may also be used at other clock rates where clock division does not occur spontaneously. It is then necessary to introduce an initial programming phase in which, as already discussed, a programming frame of length equal to the delay path and having the form "101010 . . . " is used to initialise the circuit.

Figure 1:
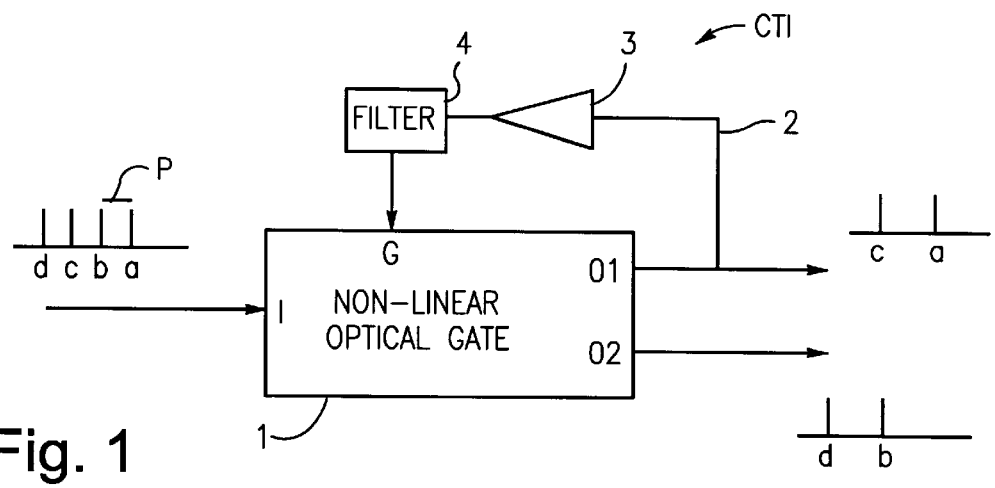
FIG. 1 is a schematic of a circuit embodying the present invention.
Figure 9:
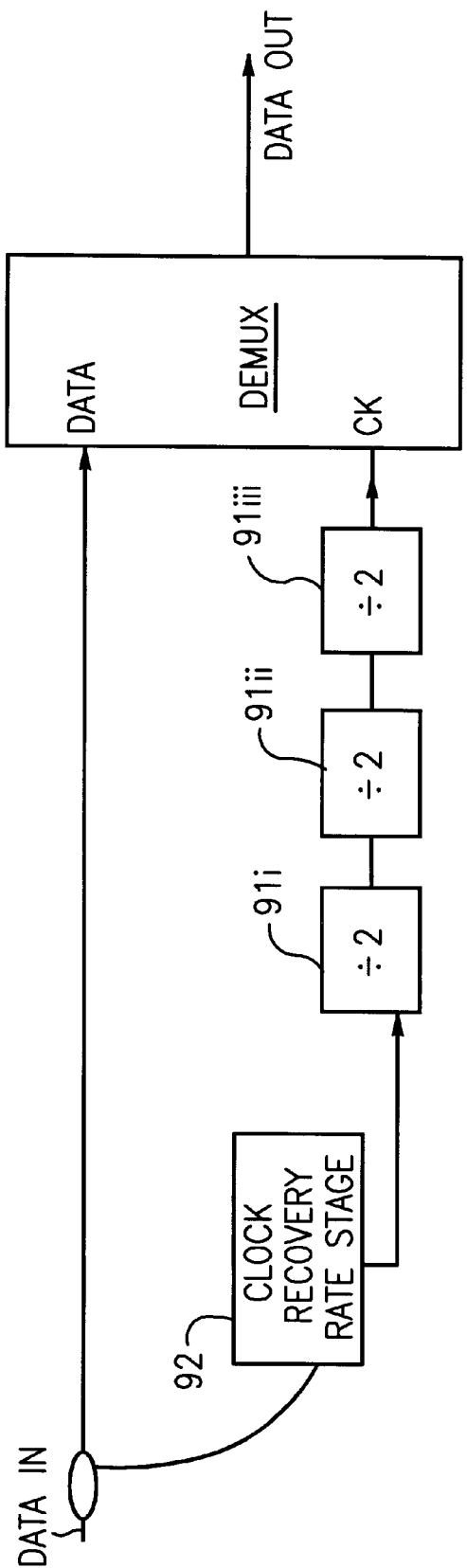
FIG. 9 shows a demultiplexer circuit including clock division stages embodying the present invention.

A further extension of the present invention is shown schematically in FIG. 9. Here a series of n clock division circuits 91i–iii generally corresponding to that of FIG. 1 are used in series to provide an overall division by $2^n$. In this example n equals 3, so that the clock rate of the output pulse stream is one eighth of that of the input bit rate. This example shows the clock division circuit used in the context of an eight-channel demultiplexer. Clock division is an important function for applications such as demultiplexing, since a clock rate which is a sub-multiple of the line rate is usually required, whereas in some all-optical clock recovery schemes, the recovered clock is at the original line rate. The clock recovery rate stage 92 shown in the figure may, for example, be that described in the paper by Patrick D M and Manning R J "20 Gbit/s All-optical Clock Recovery Using Semiconductor Non-linearity", Electron. Lett. 1994, 30, pp151–152.

Although the examples demonstrated above are at a line rate of 2.5 GHz, the invention may also be used at higher bit rates. The SOA lifetime may be controlled to establish the correct conditions for spontaneous clock division using appropriate electrical bias, and also optionally the injection of an optical bias signal as described in the papers by Manning et al: "Enhanced Recovery Rates in Semiconductor Amplifiers Using Optical Pumping", Electron. Lett. 1994, 30, pp787–788 and "Recovery Rates in Semiconductor Laser Amplifiers: Optical and Electrical Bias Dependencies", Electron. Lett. 1994, 30, pp1233–1234.

Using semiconductor techniques as disclosed in P. A. Andrekson, N. A. Olsson, J R Simpson, D J Giovanni, P A Morton, T Tanbun-Ek, R A Logan and K W Wecht, in Optical Fiber Communication, Vol 5. of 1992 OSA Technical Digest Series (Optical Society of America, Washington D.C. 1992) paper PD8 and hybrid integration techniques as disclosed in A Takada, K Aida and M Jinno, in Optical Fiber Communication, Vol.4 of 1991 OSA Technical Digest Series (Optical Society of America, Washington D.C. 1992) paper TuN3, it is possible to design certain circuits to reduce the latency to a few 10s of ps and to achieve optical processing at rates approaching 100 GHz.

What is claimed is:

1. A method of deriving a clock signal at a divided clock rate from an optical signal stream at a higher clock rate, the stream comprising a sequence of pulses having a given bit period, the method comprising:

(a) applying the optical signal stream to an input port of a single-stage all-optical non-linear gate, which gate includes a non-linear element;

(b) feeding back an optical signal from an output of the said single-stage all-optical non-linear gate, via a control input of said gate to said non-linear element, the transit time between the input port and the control input being an integer multiple of the bit period and the optical signal from the output of said gate remaining in the optical domain as the optical signal is fed back to said non-linear element; and (c) outputting an optical signal at a divided clock rate from the single-stage all-optical non-linear optical gate.

2. A method according to claim 1, in which the optical signal stream is applied to an interferometric non-linear optical gate.

3. A method according to claim 2, in which the interferometric non-linear gate comprises a non-linear loop mirror (NOLM).

4. A time-division multiplexer or demultiplexer including a clock division circuit according to claim 1.

5. A method as in claim 1, wherein said transit time is equal to an odd number of bit periods.

6. A method as in claim 5 wherein said transit time is equal to one bit period.

7. The method of claim 1, wherein pulses of the optical signal at the divided clock rate are separated by a uniform amount of time.

8. The method of claim 1, wherein the divided clock rate has a rate which is equal to the higher clock rate of the optical stream signal divided by $2^n$, n being an integer greater or equal to 1.

9. A method of deriving a clock signal at a divided clock rate from an optical signal stream at a higher clock rate, said method comprising:
   a) applying an optical signal stream to an all-optical non-linear gate, which gate includes a non-linear element;
   b) feeding back an optical signal from an output of the said all-optical non-linear gate to the said non-linear element; and
   c) outputting an optical signal at a divided clock rate from the all-optical non-linear gate;
   wherein the optical signal stream is applied to an interferometric non-linear optical gate;
   wherein the interferometric non-linear gate comprises a non-linear loop mirror (NOLM); and
   wherein the non-linear element within the NOLM is a semi-conductor optical amplifier (SOA).

10. A method of deriving a clock signal at a divided clock rate from an optical signal stream at a higher clock rate, said method comprising:
    a) applying an optical signal stream to an all-optical non-linear gate, which gate includes a non-linear element;
    b) feeding back an optical signal from an output of the said all-optical non-linear gate to the said non-linear element; and
    c) outputting an optical signal at a divided clock rate from the all-optical non-linear gate;
    wherein the optical signal stream is applied to an interferometric non-linear optical gate; and
    wherein the optical signal stream is applied to an input port of an integrated Mach Zehnder interferometer and in which the non-linear switching element is a semiconductor optical amplifier (SOA) located in at least one arm of the integrated Mach Zehnder interferometer.

11. A method of deriving a clock signal at a divided clock rate from an optical signal stream at a higher clock rate, said method comprising:
    a) applying an optical signal stream to an all-optical non-linear gate, which gate includes a non-linear element;
    b) feeding back an optical signal from an output of the said all-optical non-linear gate to the said non-linear element; and
    c) outputting an optical signal at a divided clock rate from the all-optical non-linear gate; and
    wherein the delay period associated with the optical feedback path is equal to the period (p) between bits in the optical signal stream.

12. A method comprising:
    a) applying an optical signal stream to an all-optical non-linear gate, which gate includes a non-linear element;
    b) feeding back an optical signal from an output of the said all-optical non-linear gate to the said non-linear element; and
    c) outputting an optical signal at a divided clock rate from the all-optical non-linear gate; and
    d) using an initial phase of programming the gate to carry out clock division by inputting to the gate a block of pulses having a predetermined bit-pattern and of sufficient length to fill both the gate and the feedback path.

13. A method comprising:
    a) applying an optical signal stream to an all-optical non-linear gate, which gate includes a non-linear element;
    b) feeding back an optical signal from an output of the said all-optical non-linear gate to the said non-linear element; and
    c) outputting an optical signal at a divided clock rate from the all-optical non-linear gate; and
    d) applying the said optical signal output at the divided clock rate from the gate to the input of a further all-optical non-linear gate,
    e) feeding back an optical signal from an output of the further gate to a non-linear element of the further gate, and
    f) outputting from the further gate an optical signal at a further sub-divided clock rate.

14. A method comprising:
    a) applying an optical signal stream to an all-optical non-linear gate, which gate includes a non-linear element;
    b) feeding back an optical signal from an output of the said all-optical non-linear gate to the said non-linear element; and
    c) outputting an optical signal at a divided clock rate from the all-optical non-linear gate; and
    wherein the signal stream is introduced into the optical cavity of a laser including a saturable absorber arranged to function as the said non-linear element.

15. A clock division circuit for deriving a clock signal at a divided clock rate from an optical clock stream at a higher clock rate, the stream comprising a sequence of pulses having a given bit period, the circuit comprising:
    (a) a single-stage all-optical non-linear gate, which gate includes a non-linear element; an optical input arranged to receive the optical signal stream; an optical output; a non-linear element connected between the optical input and the optical output; and
    (b) an optical feedback path from the output of the gate via a control input of said gate to said non-linear element, the transit time between the input port and the control input being an integer multiple of the bit period and the optical feedback path feeding-back an optical signal which remains in the optical domain as it is being fed back to said non-linear element; and in use an optical signal at a divided clock rate being output from the gate.

16. A clock division circuit according to claim 15, in which the gate is an interferometric non-linear optical gate.

17. A clock division circuit according to claim 16, in which the non-linear optical gate is a loop mirror (NOLM).

18. A clock division circuit according to claims 15, in which the non-linear element of the gate is a semiconductor optical amplifier (SOA).

19. A clock division circuit according to claim 18, in which the non-linear gate comprises an integrated Mach Zehnder interferometer and in which the non-linear switching element is a semiconductor optical amplifier located in at least one arm of the integrated Mach Zehnder interferometer.

20. A clock division circuit according to claims 15, including at least one further all-optical non-linear gate connected at its input to the output of the first optical gate and including a feedback path from the output of the further gate to the non-linear element of the further gate, in use the further gate outputting an optical signal at a further sub-divided clock rate.

21. The circuit of claim 15, wherein pulses of the optical signal at the divided clock rate are separated by a uniform amount of time.

22. The circuit of claim 15, wherein the divided clock rate has a rate which is equal to the higher clock rate of the optical stream signal divided by $2^n$, n being an integer greater or equal to 1.

23. A clock division circuit comprising:
   a) an all-optical non-linear gate including,
      an optical input arranged to receive an optical signal stream at a higher clock rate,
      an optical output,
      a non-linear element connected between the optical input and the optical output; and
   b) an optical feedback path from the output of the gate to the non-linear element,
   in use an optical signal at a divided clock rate being output from the gate; and
   wherein the all-optical non-linear gate is a laser and includes as the non-linear element a saturable absorber located within the optical cavity of the laser.

24. A method of deriving a clock signal at a divided clock rate from an optical signal stream at a higher clock rate, the stream comprising a sequence of pulses having a given bit period, the method comprising:
   (a) applying the optical signal stream to an input port of an all-optical non-linear gate, which gate includes a non-linear element;
   (b) feeding back an optical signal from an output of said all-optical non-linear gate via a control input of said gate to said non-linear element, the transmit time between the input port and the control input being equal to the bit period and the optical signal from the output of said gate remaining in the optical domain as the optical signal is fed back to said non-linear element; and
   (c) outputting an optical signal at a divided clock rate from the all-optical non-linear gate.

25. The method of claim 24, wherein pulses of the optical signal at the divided clock rate are separated by a uniform amount of time.

26. The method of claim 24, wherein the divided clock rate has a rate which is equal to the higher clock rate of the optical stream signal divided by $2^n$, n being an integer greater or equal to 1.

27. A clock division circuit for deriving a clock signal at a divided clock rate from an optical clock stream at a higher clock rate, the stream comprising a sequence of pulses being a given bit period, the circuit including:
   (a) an all-optical non-linear gate, which gate includes a non-linear element, an optical input to receive the optical signal stream, an optical output, a non-linear element connected between the optical input and the optical output, and a control input; and
   (b) an optical feedback path from the output of the gate via the control input of said gate to said non-linear element, the transit time between the input port and the control input being equal to the bit period and the optical feedback path feeding-back an optical signal which remains in the optical domain as it is being fed back to said non-linear element; and in use an optical signal at a divided clock rate being output from the gate.

28. The circuit of claim 27, wherein pulses of the optical signal at the divided clock rate are separated by a uniform amount of time.

29. The circuit of claim 27, wherein the divided clock rate has a rate which is equal to the higher clock rate of the optical stream signal divided by $2^n$, n being an integer greater or equal to 1.

30. A method of deriving a clock signal at a divided clock rate from an optical signal stream using an all-optical non-linear gate, the optical signal stream being formed by a sequence of optical data pulses having a bit period, the optical signal stream having a higher clock rate than the divided clock rate, wherein the all-optical non linear gate has a data input for inputting the optical signal stream having optical data pulses, a control input for receiving optical control pulses, and at least a first output port for outputting at least some of the optical data pulses, the control input having a non linear element optically connected thereto, the method comprising:
   applying the optical signal stream to the data input of the gate; and
   applying to the control input of the gate, via an optical feedback path having a transit time associated therewith, optical data output from the first output port of the gate, the transit time being such that a signal at the divided clock rate is output at the first output port of the gate and/or another output port of the gate;
   wherein the gate is configured such that if a data pulse is present at the data input, the ability of the gate to produce a corresponding data pulse at the first output port is dependent on the presence or absence of a control pulse at the control input, and if a data pulse is absent at the data input, the absence of the data pulse causes the gate not to produce a corresponding data pulse at the first output port.

31. A method according to claim 30, wherein the gate includes a second output port, the gate being configured such that if an optical data pulse is present at the data input, a corresponding data pulse is produced at either the first output port or the second output port depending on the presence or absence of a control pulse at the control input, and in which a signal at the divided clock rate is produced at the second output port of the gate.

32. The method of claim 30, wherein the optical data remains in the optical domain as the optical data is fed back to the control input of the gate in the optical feedback path.

33. A clock division circuit for deriving a clock signal at a divided clock rate from an optical clock stream at a higher clock rate than the divided clock rate, the optical signal stream being formed by a sequence of optical data pulses having a bit period, the clock division circuit comprising:

an optical feedback path having a transit time associated therewith; and an all-optical non-linear gate, the gate comprising:

a data input for inputting optical data pulses, a control input for receiving optical control pulses, at least a first data output port for outputting at least some of the optical data pulses, and a non linear element optically connected to the control input, wherein the gate is configured such that if a data pulse is present at the data input, the ability of the gate to produce a corresponding data pulse at the first output port is dependent on the presence or absence of a control pulse at the control input, if a data pulse is absent at the data input, the absence of the data pulse causes the gate not to produced a corresponding data pulse at the first output port, and the optical feedback path is arranged between the first output port of the gate and the control input of the gate such that data output from the first output port is applied via the feedback path to the control input of the gate, the transit time associated with the feedback path being such that if an optical signal stream is applied to the data input of the gate, a signal at the divided clock rate is produced at the first output port of the gate and/or another output port of the gate.

34. The circuit of claim 33, wherein the data output from the first output port remains in the optical domain as the data is being fed back by the optical feedback path.

* * * * *